(12) United States Patent
Wang et al.

(10) Patent No.: US 12,453,033 B2
(45) Date of Patent: Oct. 21, 2025

(54) ELECTRICAL MODULE AND ASSOCIATED BACKPLANE

(71) Applicant: ABB Schweiz AG, Baden (CH)

(72) Inventors: Lei Wang, Shanghai (CN); Yuehua Zou, Zhejiang (CN); Huan Shi, Zhejiang (CN); Robert Norberg, Eskilstuna (SE)

(73) Assignee: ABB SCHWEIZ AG, Baden (CH)

( * ) Notice: Subject to any disclaimer, the term of this patent is extended or adjusted under 35 U.S.C. 154(b) by 138 days.

(21) Appl. No.: 18/555,631

(22) PCT Filed: Jun. 8, 2021

(86) PCT No.: PCT/CN2021/099004
§ 371 (c)(1),
(2) Date: Oct. 16, 2023

(87) PCT Pub. No.: WO2022/257022
PCT Pub. Date: Dec. 15, 2022

(65) Prior Publication Data
US 2024/0206104 A1     Jun. 20, 2024

(51) Int. Cl.
*G06F 1/16* (2006.01)
*H01H 85/20* (2006.01)
(Continued)

(52) U.S. Cl.
CPC ........... *H05K 7/1468* (2013.01); *H01H 85/20* (2013.01); *H01R 12/732* (2013.01); *H01R 13/42* (2013.01);
(Continued)

(58) Field of Classification Search
CPC .. H05K 7/1468; H05K 7/1469; H05K 7/1471; H05K 7/1472; H05K 7/1459;
(Continued)

(56) References Cited

U.S. PATENT DOCUMENTS

| | | | | |
|---|---|---|---|---|
| 5,928,004 A | * | 7/1999 | Sumida | ............... B60R 16/0238 439/76.2 |
| 6,162,990 A | * | 12/2000 | Sakamoto | ............ H01R 9/2458 174/59 |
| 10,825,633 B2 | * | 11/2020 | Bury | ......................... H05K 1/18 |
| 2003/0082937 A1 | * | 5/2003 | Burdick | ............... H01R 9/2466 439/76.2 |

(Continued)

FOREIGN PATENT DOCUMENTS

| | | |
|---|---|---|
| CN | 106231848 A | 12/2016 |
| CN | 208539792 U | 2/2019 |

(Continued)

*Primary Examiner* — Anthony M Haughton
(74) *Attorney, Agent, or Firm* — GREENBERG TRAURIG, LLP

(57) ABSTRACT

An electrical module, a backplane for the electrical module, and a method of replacing a fuse for the electrical module. The electrical module includes a circuit board which has a power input port for inputting electric power to electrically drive an external device coupled to the electrical module. The electrical module also includes a fuse holder electrically coupled to the power input port and adapted to receive a fuse. A fuse detecting circuit is arranged on the circuit board and electrically coupled to the fuse via the fuse holder to detect a status of the fuse. An output port is arranged on the circuit board and coupled to the fuse detecting circuit to at least output detecting signals about the status of the fuse to a controller.

20 Claims, 6 Drawing Sheets

(51) Int. Cl.
  *H01R 12/73* (2011.01)
  *H01R 13/42* (2006.01)
  *H05K 1/18* (2006.01)
  *H05K 5/00* (2025.01)
  *H05K 7/00* (2006.01)
  *H05K 7/14* (2006.01)

(52) U.S. Cl.
  CPC ....... *H05K 1/18* (2013.01); *H01H 2085/2085* (2013.01); *H05K 2201/10181* (2013.01)

(58) Field of Classification Search
  CPC ........ H05K 7/1462; H05K 1/18; H05K 1/182; H05K 1/183; H05K 1/184; H05K 1/185; H01R 12/732; H01R 12/735; H01R 12/737; H01R 12/73; H01R 13/42; H01R 13/40
  See application file for complete search history.

(56) References Cited

U.S. PATENT DOCUMENTS

| | | | | |
|---|---|---|---|---|
| 2004/0214473 | A1* | 10/2004 | Maebashi | H01H 85/2045 439/620.27 |
| 2008/0268671 | A1* | 10/2008 | Harris | H01R 12/523 439/76.2 |
| 2015/0009640 | A1* | 1/2015 | Stern | H01R 43/18 361/752 |
| 2020/0027681 | A1* | 1/2020 | Bury | H05K 1/18 |

FOREIGN PATENT DOCUMENTS

| | | |
|---|---|---|
| CN | 109664842 A | 4/2019 |
| CN | 110366766 A | 10/2019 |
| CN | 111572346 A | 8/2020 |
| JP | H09173535 A | 7/1997 |

* cited by examiner

ELECTRICAL MODULE AND ASSOCIATED BACKPLANE

CROSS-REFERENCE TO RELATED APPLICATIONS

This is a national stage application claiming priority to international patent application Serial No.: PCT/CN2021/099004, filed on Jun. 8, 2021; which is herein incorporated by reference in its entirety.

FIELD

Embodiments of the present disclosure generally relate to an electrical module such as an Input/Output module, and more specifically, to a backplane for at least one electrical module and a method of replacing a fuse for an electrical module.

BACKGROUND

Most control systems such as programmable logic controllers, distributed control systems or fieldbus control systems, industrial PCs, etc., must have some means of receiving and interpreting signals from real-world sensors such as switches, and encoders, and also be able to effect control over real-world control elements such as solenoids, valves, and motors. This is generally known as input/output, or I/O, capability. Electrical modules such as Input/Output (I/O) Modules act as mediators between the controller and the input/output devices such as sensors and control elements. The input modules receive signals from switches or sensors and send them to the controller and the output modules take back the control signals to the control elements.

Nowadays, replaceable I/O modules are developed. With the replaceable I/O modules, individual I/O modules may be easily replaced in the event of failure without having to replace the entire system. Furthermore, specific I/O modules may be chosen for custom applications, e.g., biasing toward discrete modules, i.e., digital modules for applications using many on/off inputs and outputs, or biasing toward analog modules for applications using analog signals. Fuses are typically needed in the I/O module for I/O protection and/or field device protection because the fuses can interrupt faults quickly.

SUMMARY

Embodiments of the present disclosure provide an electrical module, a backplane for at least one electrical module and a method of replacing a fuse for an electrical module.

In a first aspect, an electrical module is provided. The electrical module comprises a circuit board comprising a power input port for inputting electric power to at least power and/or electrically drive an external device coupled to the electrical module; a fuse holder electrically coupled to the power input port and adapted to receive a fuse; a fuse detecting circuit arranged on the circuit board and electrically coupled to the fuse via the fuse holder to detect a status of the fuse; and an output port arranged on the circuit board and coupled to the fuse detecting circuit to at least output detecting signals about the status of the fuse to a controller.

With the electrical module according to embodiments of the present disclosure, the fuse can be integral in the electrical module. In comparison to the conventional solutions where the fuse is typically arranged in a module termination unit (MTU), etc., the additional electrical lines routed from the MTU back to the electrical module and used to provide signals about the status of the fuse to the controller are no longer needed. In this way, the fuse can be replaced more easily and safely. Furthermore, when a fuse of an electrical module needs to be replaced, it is no longer necessary to break the power supply to the entire backplane, but it is only necessary to unplug the corresponding electrical module to replace the blown fuse. In this way, economic losses and maintenance costs are further reduced.

In some embodiments, the circuit board further comprises at least one signal input/output port adapted to input an external signal of the external device and/or output a controller signal to the external device, wherein the output port is further adapted to provide the detecting signals based on the external signal to the controller.

In some embodiments, the circuit board further comprises a circuit isolation unit at least arranged between the power input port and the output port to isolate the power input port and the output port, wherein the fuse detecting circuit is coupled to the output port via the circuit isolation unit. This arrangement can further improve the safety performance of the electrical module.

In some embodiments, the circuit board further comprises an indicating circuit coupled to the fuse detecting circuit via the circuit isolation unit and adapted to indicate the status of the fuse by using at least one of a light emitting unit or a sound emitting unit. This arrangement can inform the user about the status of the fuse more intuitively while reporting the status of the fuse to the controller.

In some embodiments, the circuit isolation unit comprises a photoelectric converter, a transformer or a capacitor. This arrangement can allow the safety performance of the electrical module in a cost effective way.

In some embodiments, the fuse holder comprises a clamping portion adapted to clamp the fuse; and soldering pins fixedly connected to the clamping portion and arranged on the circuit board so that the fuse is electrically coupled to the power input port, wherein the soldering pins each comprises a bent portion to allow sections of the soldering pins adjacent to the clamping portion to extend parallel to the circuit board. In this way, the electrical module can be made thinner, so that more electrical modules can be accommodated in a backplane. Furthermore, this arrangement allows the fuse holder to use the existing fuse holder with only a few structural adjustments, thereby eliminating the need for special design and manufacturing, and further reducing the cost.

In some embodiments, the sections of the soldering pins adjacent to the clamping portion extends beyond an edge of the circuit board so that the clamping portion is outside a boundary limited by edges of the circuit board. This arrangement can make the electrical module thinner.

In some embodiments, the electrical module further comprises an enclosure for housing the circuit board and the fuse holder and comprising an opening; and a cap adapted to be inserted into the opening and comprising a receiving slot for receiving the fuse to allow the fuse to be inserted in the clamping portion together with a first side wall of the receiving slot. The arrangement allows the user to replace the fuse more easily.

In some embodiments, the cap further comprises a handle arranged on a wall of the cap away from the first side wall and shaped to provide a gap between the cap and the enclosure when the cap is inserted into the opening to at least facilitate a pulling operation of the cap. This arrangement can facilitate the pulling operation of the cap, to thereby simplify the replacement of the fuse.

In some embodiments, the enclosure further comprises at least one rib arranged in the opening and abutting against the circuit board to prevent accidental shaking of the circuit board. This arrangement can ensure that the circuit board and the fuse are firmly fixed in the enclosure.

In a second aspect, a backplane is provided. The backplane comprises at least one slot each for receiving an electrical module as mentioned in the first aspect to allow the electrical module to be coupled to a power source and/or an external device; and at least one shielding portion arranged to shield a cap of the electrical module when the electrical module is received in the corresponding slot.

In a third aspect, a method of replacing a fuse for an electrical module is provided. The method comprises pulling out the electrical module from a slot of a backplane; pulling out a cap of the electrical module from an enclosure of the electrical module to drive the fuse out of a clamping portion; replacing the fuse with a new fuse; inserting the cap into the enclosure; and inserting the electrical module into the corresponding slot.

It is to be understood that the Summary is not intended to identify key or essential features of embodiments of the present disclosure, nor is it intended to be used to limit the scope of the present disclosure. Other features of the present disclosure will become easily comprehensible through the description below.

BRIEF DESCRIPTION OF THE DRAWINGS

The above and other objectives, features and advantages of the present disclosure will become more apparent through more detailed depiction of example embodiments of the present disclosure in conjunction with the accompanying drawings, wherein in the example embodiments of the present disclosure, same reference numerals usually represent the same components.

Throughout the drawings, the same or similar reference symbols are used to indicate the same or similar elements.

DETAILED DESCRIPTION

Figure 1:
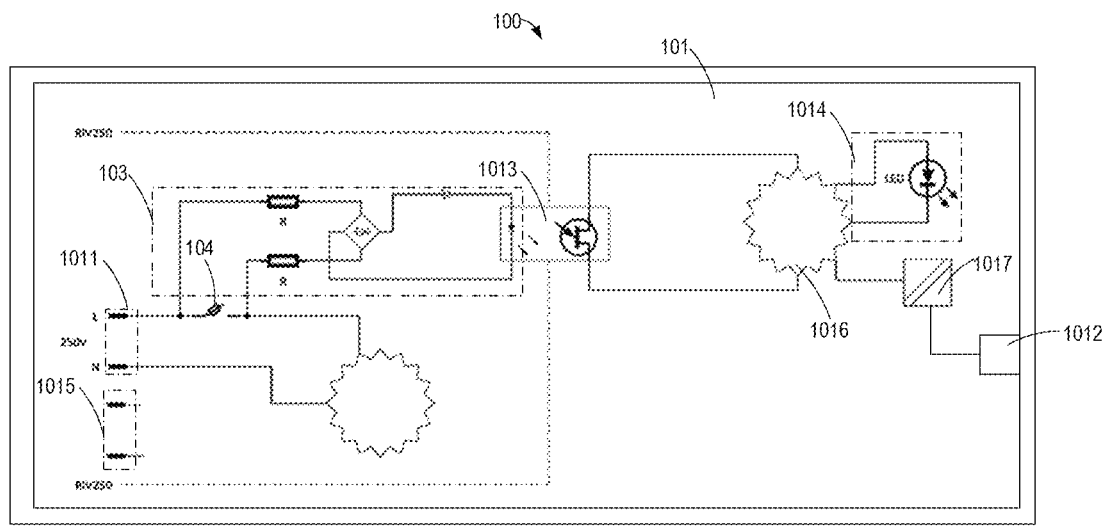
FIG. 1 shows a simplified schematic diagram of a simplified circuit of an electrical module relating to a fuse according to embodiments of the present disclosure.

The present disclosure will now be discussed with reference to several example embodiments. It is to be understood these embodiments are discussed only for the purpose of enabling those skilled persons in the art to better understand and thus implement the present disclosure, rather than suggesting any limitations on the scope of the subject matter.

As used herein, the term "comprises" and its variants are to be read as open terms that mean "comprises, but is not limited to." The term "based on" is to be read as "based at least in part on." The term "one embodiment" and "an embodiment" are to be read as "at least one embodiment." The term "another embodiment" is to be read as "at least one other embodiment." The terms "first," "second," and the like may refer to different or same objects. Other definitions, explicit and implicit, may be comprised below. A definition of a term is consistent throughout the description unless the context clearly indicates otherwise.

A fuse is typically electrically coupled to a printed circuit board of an electrical module such as an Input/Output (I/O) module via a fuse holder. The fuse holder is usually mounted on the printed circuit board vertically. That is, the extending direction of the whole fuse holder is perpendicular to the printed circuit board, causing a large width of the I/O module. The excessive width of the I/O module fails to meet the demand for miniaturized equipment.

Furthermore, a standard fuse typically has two terminals, i.e., two pins, which are connected to a power supply for supplying electric power to and/or for electrically driving an external device coupled to the I/O module. Typically, the fuse is assembled in a module termination unit (MTU) or field terminal block (FTB) to which the I/O module is coupled. In conventional solutions, to supervise the status of the fuse, i.e., to provide the status of the fuse to a controller, two additional electrical lines need to be routed from the MTU or FTB to the I/O module to provide signals about the status of the fuse to the controller. As a result, the process of sending the status of the fuse to the controller becomes very complicated, resulting in some disadvantages such as large-sized modules, complex wiring, inflexible FTB and/or increased maintenance costs.

Furthermore, for an I/O backplane with several I/O modules, to replace a blown fuse of an electrical module, system power for the whole backplane needs to be turned off, causing a certain economic loss and a further increase in maintenance costs. Even so, maintenance personnel still have the risk of electric shock during the process of replacing the fuse.

In order to at least partially address the above and other potential problems, embodiments of the present disclosure provide an electrical module 100 and a backplane 200 for receiving at least one electrical module 100. Now some example embodiments will be described with reference to FIGS. 1-10.

The electrical module 100 according to embodiments of the present disclosure may be an I/O module that may be arranged in a slot of a backplane 200. That is, the electrical module 100 according to embodiments of the present disclosure can receive signals from switches or sensors and send them to a controller. The controller may be a central processing unit for controlling multiple electrical modules 100. The controller can process the detecting signals provided by the multiple electrical modules 100 and generate corresponding controller signals for controlling the control device. In some alternative embodiments, the controller may also be a controller that controls a single electrical module 100. The electrical module 100 also can take back the controller signals to the control devices like motor starters to thereby control them.

In some embodiments, the electrical module may also be a separate input module or output module. That is, in some embodiments, the electrical module 100 according to embodiments of the present disclosure can either receive signals from switches or sensors and send them to a controller or can take back the controller signals to the control devices like relays or motor starters. In the following, the concept of the present disclosure will be discussed mainly by taking the I/O module as an example of the electrical module 100. It is to be understood that the concept of the present disclosure may also be applied to other electrical modules 100 with similar functions. Furthermore, the backplane 200 as mentioned above can receive a plurality of electrical modules 100, which will be discussed further in the following.

Figure 2:
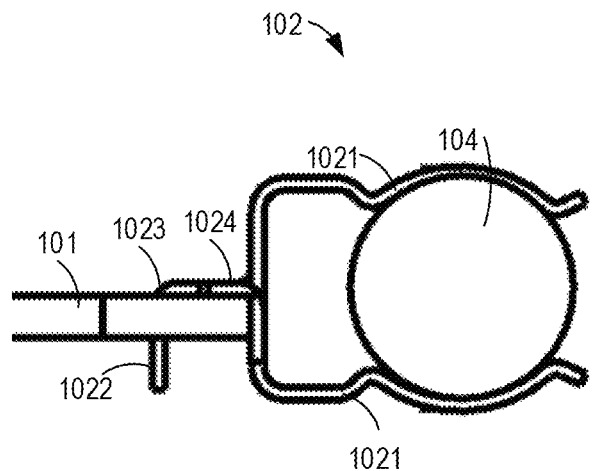
FIG. 2 shows a side view of a fuse holder of an electrical module arranged on a circuit board according to embodiments of the present disclosure.

FIG. 1 shows a simplified schematic diagram of a circuit of an electrical module 100, and FIG. 2 shows a side view of a fuse holder 102 of an electrical module 100 arranged on a circuit board 101 according to embodiments of the present disclosure. As shown in FIGS. 1 and 2, generally, the electrical module 100 such as an I/O module comprises a circuit board 101, a fuse holder 102 mounted on the circuit board 101, a fuse detecting circuit 103 and an output port 1012. In addition, it is to be understood that the positions of these components shown in FIG. 1 are only schematic and are not intended to limit the protection scope of the present disclosure. Any other suitable structures or arrangements are possible, and will not be listed one by one in the following.

The circuit board 101 is adapted to carry electrical components of the electrical module 100 and comprising, among other things, a power input port 1011 and the output port 1012. The power input port 1011, which may be pins to be plugged into corresponding interfaces of the backplane 200, is coupled to a power supply, e.g., of the backplane 200 to at least power and/or electrically drive external devices such as sensors and/or control devices such as actuators or relays. For example, the power supply provided through the power input port 1011 may supply power with dangerous voltage such as 220V or above to the external device, e.g., switches, sensors for sensing external signals such as voltage, current, etc., or control devices such as motor starters or any other suitable devices. In some alternative embodiments, the power supply provided through the power input port 1011 may also be used to electrically drive a relay via a relay output port. In some further alternative embodiments, the power supply provided through the power input port 1011 may also be used to power the electrical module via suitable isolation units. The output port 1012 provides an approach for outputting detecting signals to a controller. The output port 1012 herein may be any suitable means via which the detecting signals may be transmitted to the controller. For example, in some embodiments, the detecting signals at least based on the status of the fuse may also be transmitted to the controller through any suitable interface module, such as communication interfaces with Ethernet ports.

The output port 1012 may have any appropriate interface form to achieve the above function. For example, in some embodiments, the output port 1012 may be a tangible interface that may be coupled to a controlling device having the controller via wires or optical fibers, so as to output the detecting signals to the controller. Furthermore, alternatively or additionally, in some embodiments, the output port 1012 may also be a wireless transceiver module to output detecting signals to the controller wirelessly.

Besides the power input port 1011 and the output port 1012 as mentioned above, in some embodiments, the electrical module 100 may further comprise at least one signal input/output port 1015. The at least one signal input/output port 1015 may be used to input external signals such as signals received from the external device such as switches or sensors coupled to the electrical module 100. Additionally or alternatively, the signal input/output port 1015 may also be used to output controller signals to the control devices like motor starters to control the control devices. Furthermore, in some embodiments, the signal input/output port 1015 may also comprise at least one dedicated output port such as a relay output port to control some external devices.

The fuse detecting circuit 103 is arranged on the circuit board 101 and electrically coupled to the fuse 104 via the fuse holder 102 to detect a status of the fuse 104. In some embodiments, as shown in FIG. 1, the fuse detecting circuit 103 may be a rectifying circuit. When the fuse 104 is blown, the fuse detecting circuit 103 may provide the status to the output port 1012 via suitable circuit or isolation circuit. For example, in some embodiments, the electrical module 100 may further comprise a processing unit 1016. The processing unit 1016 is coupled to the fuse detecting circuit 103 and can receive the status of the fuse 104. The processing unit 1016 can then provide detecting signals, with or without processing the status of the fuse 104, to the output port 1012, and then the output port 1012 provides the detecting signals to the controller. The controller can then generate corresponding control signals, e.g., indicating the user to replace the fuse 104, and provide the control signals to the user in any suitable means.

In some embodiments, as shown in FIG. 1, the electrical module 100 may comprise an isolation unit 1017 such as a transformer arranged between the processing unit 1016 and the controller to prevent the controller from being damaged by dangerous voltage, thereby further improving the stability of the electrical module 100. In some embodiments, the isolation unit 1017 may also be a part integral with the output port 1012.

In some alternative embodiments, the processing unit 1016 may be a unit that can process the status of the fuse 104 and/or the external signals to provide the detecting signals based on the status of the fuse 104 and/or the external signals. That is, in some embodiments, before the signals received from switches or sensors of external devices and/or signals about the status of the fuse 104 are provided to the controller, the processing unit 1016 may process them to generate the detecting signals to be provided to the controller.

With the electrical module 100 according to embodiments of the present disclosure, the fuse 104 is allowed to be integral in the electrical module 100. In comparison to the conventional solutions, the fuse detecting circuit 103 and the output 1012 arranged on the circuit board 101 can be used to detect the status of the fuse and provide it to the controller. That is, the signals about the status of the fuse 104 can be provided to the controller without additional electrical lines. In this way, only two pins of the fuse holder 102 mounted on the circuit board 101 are needed, thereby reducing or eliminating the risk of exposure to hazard voltage above 36V during the replacement of the fuse 104. In this way, the fuse 104 can be replaced more easily and safely.

Furthermore, in some embodiments, the electrical module 100 is hot-pluggable. With the electrical module 100 according to embodiments of the present disclosure, when a fuse 104 of an electrical module 100 arranged in the backplane 200 which receiving a plurality of electrical modules 100 is needed to be replaced, it is no longer necessary to break the power supply to the entire backplane 200, but it is only necessary to pull out the corresponding electrical module 100 to replace the blown fuse 104. In this way, economic losses and maintenance costs are further reduced.

Furthermore, besides the above mentioned components arranged on the circuit board 101, in some embodiments, the circuit board 101 may further comprise a circuit isolation unit 1013 arranged between a hazard voltage circuit and a safely extra-low voltage circuit to provide more safety performance. As shown in FIG. 1, the fuse detecting circuit 103, the signal input/output port 1015 and the power input port 1011 belong to the hazard voltage circuit. The processing unit 1016 and the output port 1012 belong to the safely extra-low voltage circuit. The fuse detecting circuit 103 is coupled to the processing unit 1016 via the circuit isolation unit 1013.

The circuit isolation unit 1013 may be any suitable isolation unit that can provide isolation between a hazard voltage circuit and a safely extra-low voltage circuit. For example, in some embodiments, as shown in FIG. 1, the circuit isolation unit 1013 may comprise a photoelectric converter, which further contributes to the miniaturization and low cost of the electrical module 100. In some alternative embodiments, the circuit isolation unit 1013 may also comprise a transformer or a capacitor.

Besides sending the status of the fuse 104 to the controller by using the fuse detecting circuit 103 and the processing unit 1016, in some embodiments, the circuit board 101 may further comprise an indicating circuit 1014 to indicate the status of the fuse 104 directly. The indicating circuit 1014 may comprise at least one of a light emitting unit or a sound emitting unit, by means of which the status of the fuse 104 can be indicated to a user. For example, when the fuse 104 is blown, the light emitting unit of the indicating circuit 1014 may emit light to alarm the user that the fuse 104 is blown and needs to be replaced. In this way, users can perform replacement operations timely.

In addition to the improvements on these circuits or units of the electrical module 100 as mentioned above, in order to further promote the miniaturization of the electrical module 100, the inventors have also made structural improvements.

Specifically, in some embodiments, the structure of the fuse holder 102 is adjusted. As well known, the conventional fuse holder 102 typically comprises a clamping portion 1021 adapted to clamp a fuse 104 and soldering pins 1022. The soldering pins 1022, also known as soldering lugs, are fixedly connected to the clamping portion 1021 and arranged on the circuit board 101 by soldering to provide electrical coupling between the fuse 104 and the power input port 1011. In the conventional solutions, the soldering pins 1022 typically extend in a single direction and arranged perpendicular to the circuit board 101, which results in a large width of the circuit board 101.

In comparison to the conventional solutions, each of the soldering pins 1022 of the fuse holder 102 according to embodiments of the present disclosure comprises a bent portion 1023, as shown in FIG. 2. With the bent portion 1023, a section 1024 of the soldering pin 1022 adjacent to the clamping portion 1021 extends parallel to the circuit board 101, to thereby allow a significantly reduced width of the circuit board 101.

In some embodiments, the section 1024 of the soldering pin 1022 adjacent to the clamping portion 1021 may also extend beyond an edge of the circuit board 101. In this way, the clamping portion 1021 can be located outside a boundary limited by edges of the circuit board 101. As a result, the circuit board 101 and at least a part of the clamping portion 1021 overlap in the thickness direction, so that the thickness of the electrical module 100 can be further reduced, to thereby further facilitate the miniaturization of the electrical module 100.

Furthermore, the fuse holder 102 according to embodiments of the present disclosure may be obtained by simply bending the soldering pins 1022 of the conventional fuse holder 102, without the need for special redesign and manufacturing. In this way, the costs for improving the electrical module 100 to achieve the miniaturization of the electrical module 100 may be further reduced.

Figure 3:
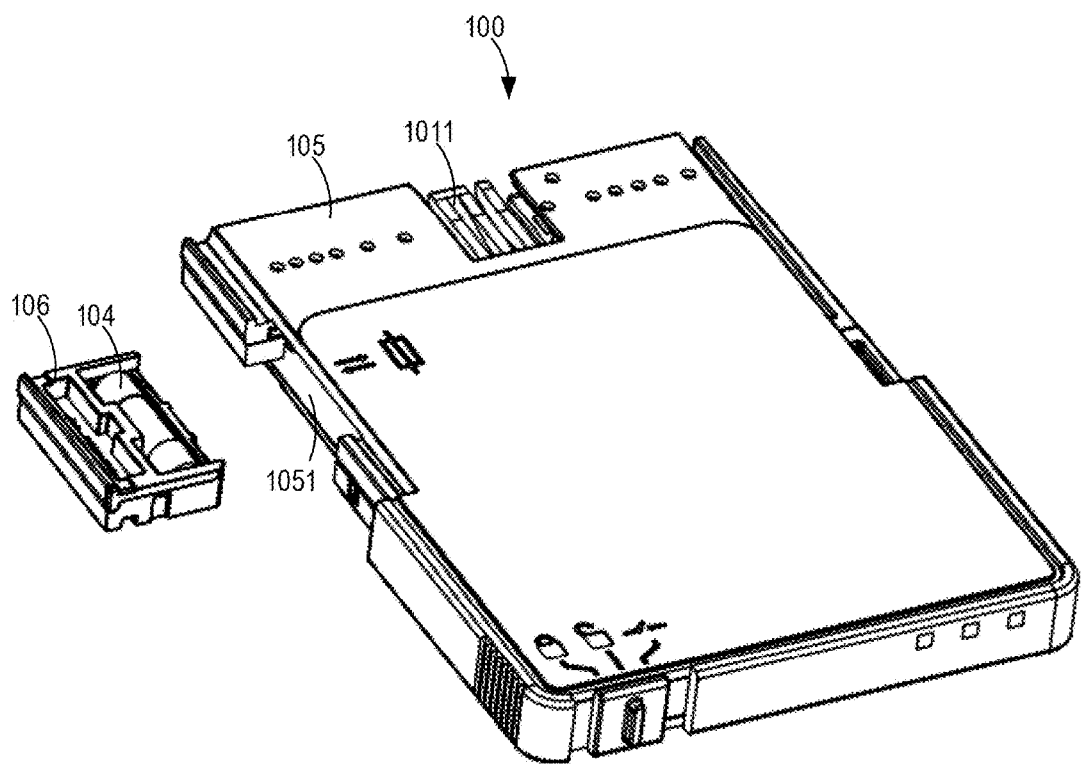
FIG. 3 shows a perspective view of an electrical module according to embodiments of the present disclosure, wherein a cap is out of an enclosure of the electrical module.
Figure 4:
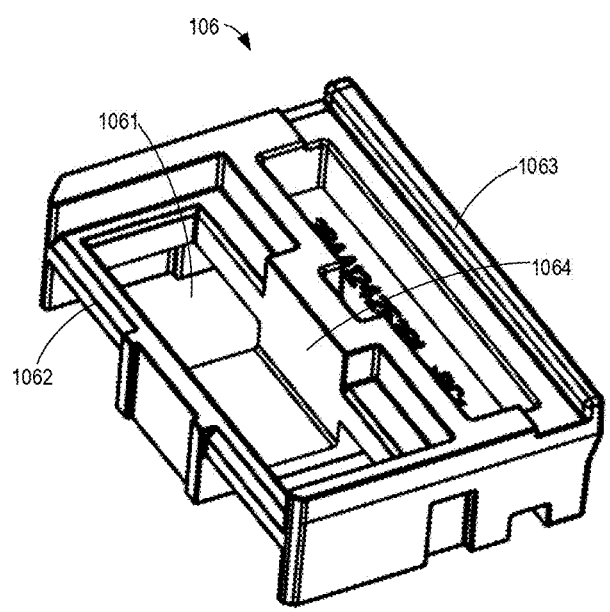
FIGS. 4 and 5 show perspective views of a cap of an electrical module according to embodiments of the present disclosure.
Figure 5:
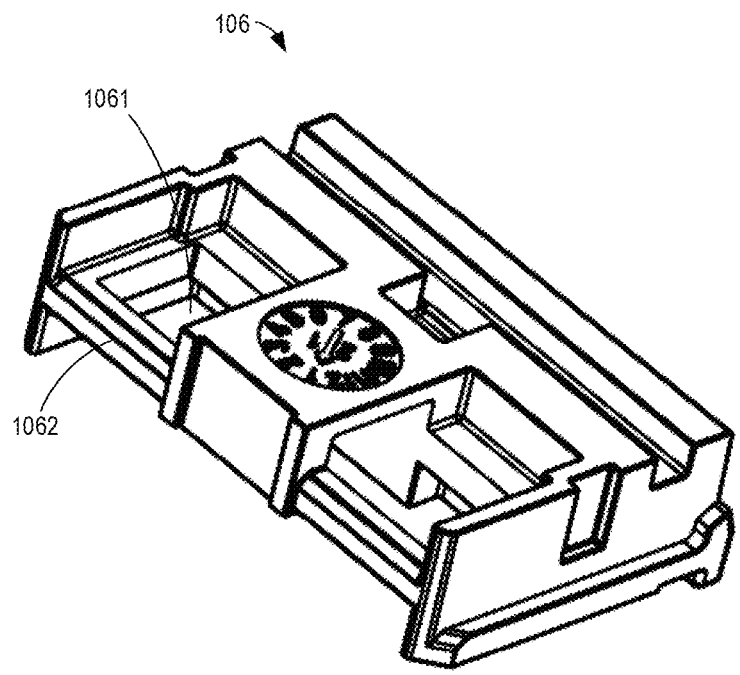

In addition, with the structure of the fuse holder 102 according to embodiments of the present disclosure, the fuse 104 may be replaced more easily. For example, as shown in FIG. 3, the electrical module 100 may further comprise a cap 106 and an enclosure 105 for housing the circuit board 101 and the fuse holder 102. The enclosure 105 comprises an opening 1051 into which the cap 106 can be inserted. As shown in FIGS. 3-5, the cap 106 comprises a receiving slot 1061 for receiving the fuse 104.

Figure 6:
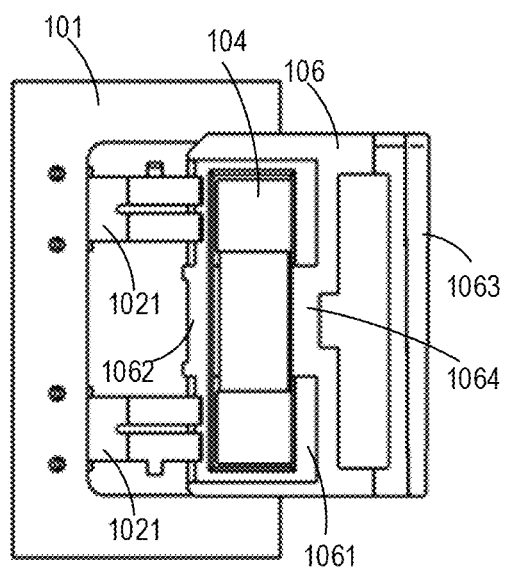
FIGS. 6 and 7 shows top views of a cap and a fuse holder of an electrical module during installation of a fuse into the fuse holder according to embodiments of the present disclosure.
Figure 7:
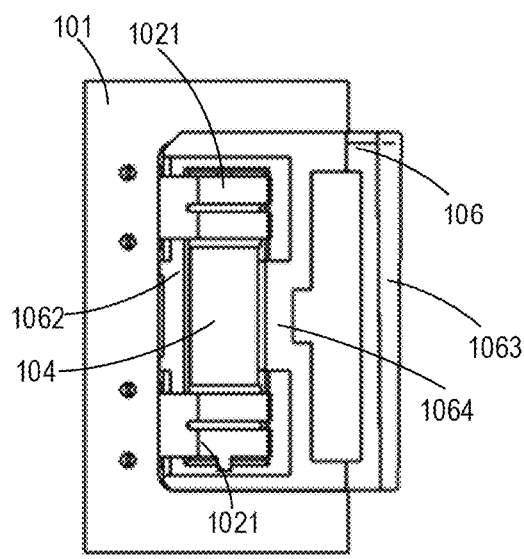
Figure 8:
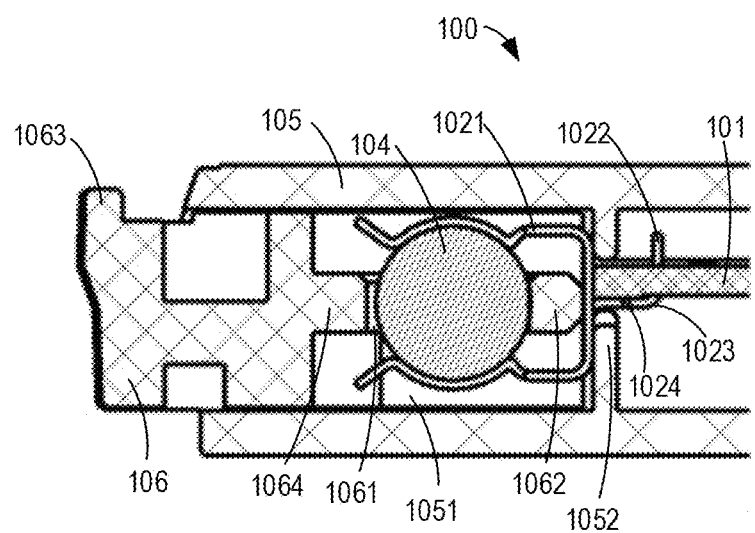
FIG. 8 shows a side cross-sectional view of a portion of an electrical module relating to a fuse according to embodiments of the present disclosure.

The receiving slot 1061 may comprise a bottom to prevent the fuse 104 from accidentally dropping. Besides the bottom, the receiving slot 1061 may further comprise two side walls in a pushing direction of the cap 106, namely a first side wall 1062 and a second side wall 1064, as shown in FIGS. 4 and 5. During the insertion of the cap 106 into the opening 1051, the fuse 104 can be inserted in the clamping portion 1021 together with the first side wall 1062 of the receiving slot 1061, as shown in FIGS. 6 and 7. That is, at least a portion of the first side wall 1062 of the receiving slot 1061 is sized to be smaller than a size of an opening of the clamping portion 1021, as shown in FIG. 8. In this way, the first side wall 1062 may be inserted into the clamping portion 1021 without interfering with the clamping portion 1021 when the cap 106 is inserted into the opening 1051 of the enclosure 105.

When the fuse 104 needs to be replaced, after the electrical module 100 is pulled out of the backplane 200, a user only needs to pull out the cap 106 to replace the fuse 104. The first side wall 1062 of the receiving slot 1061 will drive the fuse 104 out of the clamping portion 1021, so the user can perform the replacement easily. After a new fuse is received in the receiving slot 1061, the user can then insert the cap 106 into the opening 1051 while the fuse 104 being pushed by the second side wall 1064, so that the fuse 104 can be clamped by the clamping portion 1021.

To facilitate the pulling operation of the cap 106, in some embodiments, as shown in FIGS. 4, 5 and 8, the cap 106 may further comprise a handle 1063 arranged on a wall of the cap 106 away from the first side wall 1062. The handle 1063 is shaped to provide a gap between the cap 106 and the enclosure 105 when the cap 106 is inserted into the opening 1051. In this way, the user's nail or similar objects can insert into the gap to pull out the cap 106 easily.

It is to be understood that the above embodiments where the handle 1063 provides the gap between the cap 106 and the enclosure 105 are merely for illustrative purposes, without suggesting any limitation as to the scope of the present disclosure. Any other suitable structure or arrangement is also possible. For example, in some alternative embodiments, the handle 1063 may also provide a structure or arrangement that is convenient for being clamped.

To prevent accidental shaking of the circuit board 101 and the fuse holder 102 in the enclosure 105, the enclosure 105 may further comprise at least one rib 1052 arranged in the opening 1051 and abutting against the circuit board 101 in the thickness direction. In this way, the circuit board 101 and the fuse holder 102 can be firmly fixed in the enclosure 105.

According to other aspects of the present disclosure, a backplane 200 for receiving at least one electrical module 100 as mentioned above is provided. The backplane 200 comprises at last one slot 201 and at least one shielding portion 203. The slot 201 is used to receive an electrical module 100 to allow the electrical module 100 to be coupled to a power source and/or an external device.

Figure 9:
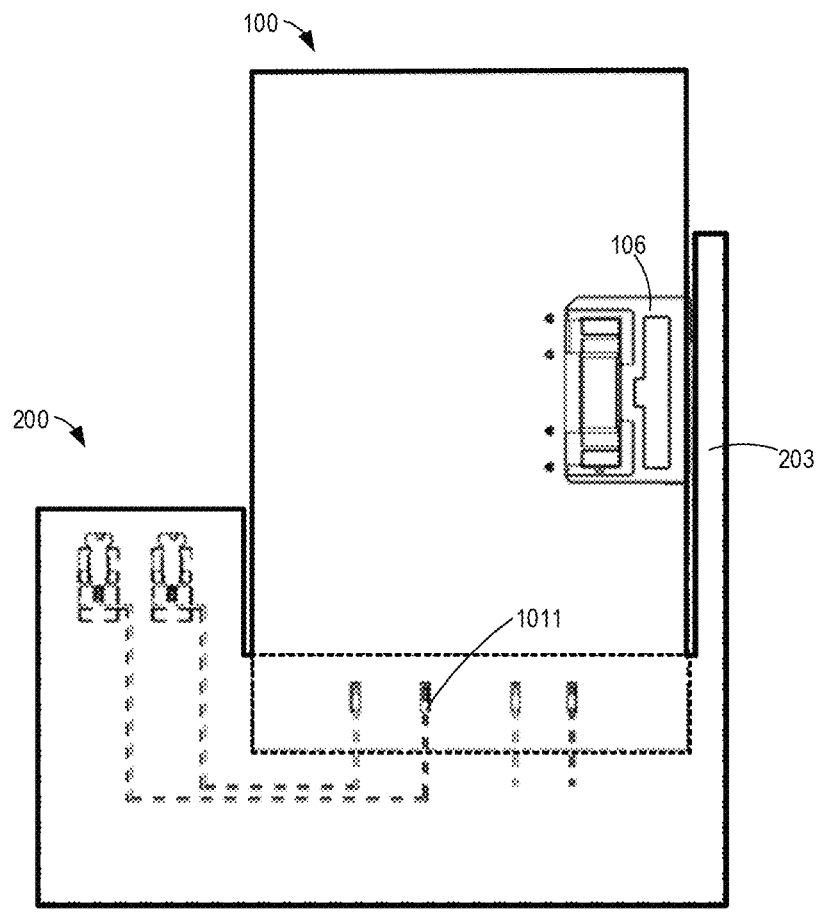
FIG. 9 shows a simplified side view of a backplane with an electrical module according to embodiments of the present disclosure.
Figure 10:
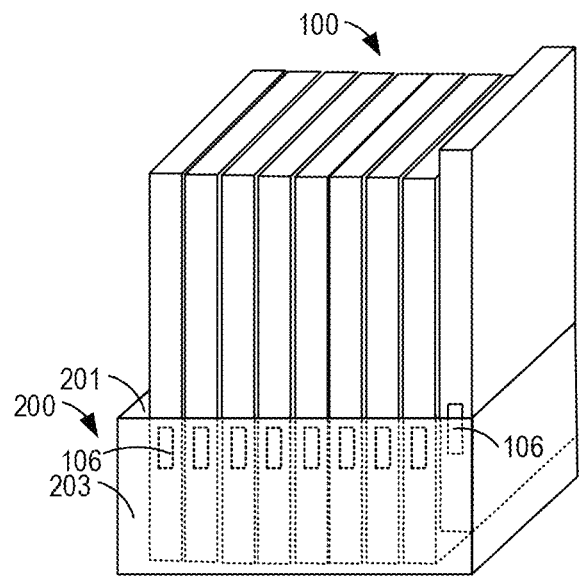
FIG. 10 shows a simplified perspective view of a backplane with a plurality of electrical modules according to embodiments of the present disclosure.

The shielding portion 203 can shield the cap 106 of the electrical module 100 when the electrical module 100 is received in the corresponding slot 201, as shown in FIGS. 9 and 10. In this way, a user can operate the cap 106 to replace the fuse 104 only when the electrical module 100 is pulled out from the slot 201 of the backplane 200, thereby further reducing the risk of electric shock and further improving the safety performance.

Figure 11:
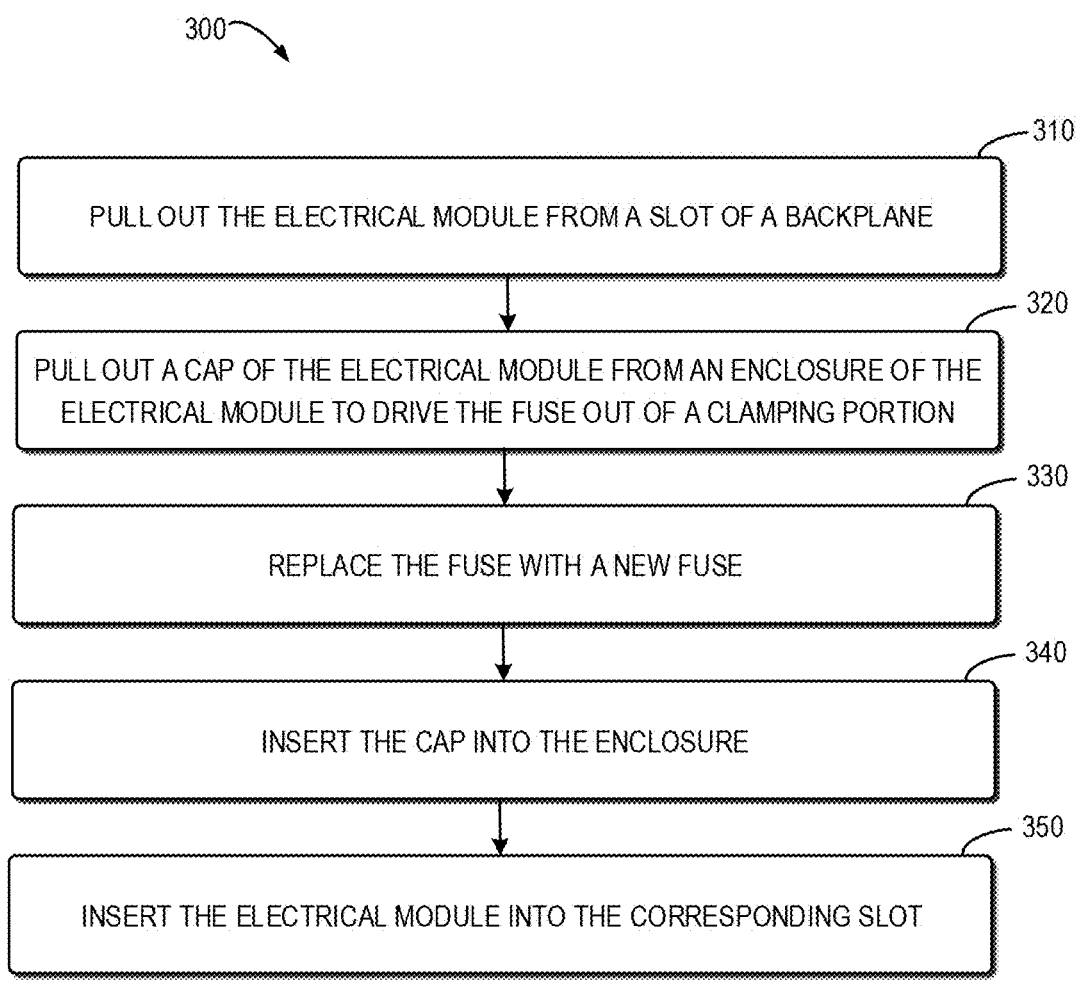
FIG. 11 shows a flowchart illustrating a method of replacing a fuse for an electrical module according to embodiments of the present disclosure.

According to other aspects of the present disclosure, a method 300 of replacing a fuse 104 for an electrical module 100 is provided. FIG. 11 shows a flowchart illustrating a method of replacing a fuse 104 for an electrical module 100 according to embodiments of the present disclosure. As shown in FIG. 11, in block 310, when a fuse 104 needs to be replaced, e.g., upon indication of the indicating circuit 1014 and/or a controller, the electrical module 100 may be pulled out from the slot 201 of the backplane 200, with the hazard voltage circuit being disconnected at the same time. In some embodiments, the electrical module 100 may be locked during normal operation. Thus, before pulling out of the electrical module 100, the electrical module 100 may be unlocked first.

In block 320, the cap 106 is pulled out of the enclosure 105 to thereby drive the fuse 104 out of the clamping portion 1021. Then, in block 330, the fuse 104 is replaced with a new fuse 104. After the new fuse 104 is placed in the receiving slot 1061 of the cap 106, in block 340, the cap 106 is inserted into the opening 1051 of the enclosure 105. After that, in block 350, the electrical module 100 can be inserted into the corresponding slot 201. In this way, the fuse 104 can be replaced without risk of electric shock in a simple manner.

It is to be understood that while method 300 describes a series of operations that are performed in a sequence, method 300 is not limited by the order of the sequence depicted. For instance, some operations may occur in a different order than that described. In addition, one operation may occur concurrently with another operation. In some embodiments, not all operations described are performed. In some embodiments, not all operations performed are illustrated.

It should be appreciated that the above detailed embodiments of the present disclosure are only for exemplifying or explaining principles of the present disclosure and do not limit the present disclosure. Therefore, any modifications, equivalent alternatives and improvements, etc. without departing from the spirit and scope of the present disclosure shall be comprised in the scope of protection of the present disclosure. Meanwhile, appended claims of the present disclosure aim to cover all the variations and modifications falling under the scope and boundary of the claims or equivalents of the scope and boundary.

What is claimed is:

1. An electrical module comprising:
   a circuit board comprising a power input port for inputting electric power to at least power and/or electrically drive an external device coupled to the electrical module;
   a fuse holder electrically coupled to the power input port and adapted to receive a fuse;
   a fuse detecting circuit arranged on the circuit board and electrically coupled to the fuse via the fuse holder to detect a status of the fuse; and
   an output port arranged on the circuit board and coupled to the fuse detecting circuit to at least output detecting signals about the status of the fuse to a controller.

2. The electrical module of claim 1, wherein the circuit board further comprises:
   at least one signal input/output port adapted to input an external signal of the external device and/or output a controller signal to the extern device,
   wherein the output port is further adapted to provide the detecting signals based on the external signal to the controller.

3. The electrical module of claim 1, wherein the circuit board further comprises:
   a circuit isolation unit at least arranged between the power input port and the output port to isolate the power input port and the output port,
   wherein the fuse detecting circuit is coupled to the output port via the circuit isolation unit.

4. The electrical module of claim 3, wherein the circuit board further comprises:
   an indicating circuit coupled to the fuse detecting circuit via the circuit isolation unit and adapted to indicate the status of the fuse by using at least one of a light emitting unit or a sound emitting unit.

5. The electrical module of claim 3, wherein the circuit isolation unit comprises a photoelectric converter, a transformer or a capacitor.

6. The electrical module of claim 1, wherein the fuse holder comprises:
   a clamping portion adapted to clamp the fuse; and
   soldering pins fixedly connected to the clamping portion and arranged on the circuit board so that the fuse is electrically coupled to the power input port,
   wherein the soldering pins each comprises a bent portion to allow sections of the soldering pins adjacent to the clamping portion to extend parallel to the circuit board.

7. The electrical module of claim 6, wherein the sections of the soldering pins adjacent to the clamping portion extend beyond an edge of the circuit board so that the clamping portion is outside a boundary limited by edges of the circuit board.

8. The electrical module of claim 6, further comprising:
   an enclosure for housing the circuit board and the fuse holder and comprising an opening; and
   a cap adapted to be inserted into the opening and comprising a receiving slot for receiving the fuse to allow the fuse to be inserted in the clamping portion together with a first side wall of the receiving slot.

9. The electrical module of claim 8, wherein the cap further comprises:
   a handle arranged on a wall of the cap away from the first side wall and shaped to provide a gap between the cap and the enclosure when the cap is inserted into the opening to at least facilitate a pulling operation of the cap.

10. The electrical module of claim 8, wherein the enclosure further comprises:
at least one rib arranged in the opening and abutting against the circuit board to prevent accidental shaking of the circuit board.

11. A backplane comprising:
at least one slot each for receiving an electrical module of claim 1 to allow the electrical module to be coupled to a power source and/or an external device; and
at least one shielding portion arranged to shield a cap of the electrical module when the electrical module is received in the corresponding slot.

12. A method of replacing a fuse for an electrical module of claim 1, comprising:
pulling out the electrical module from a slot of a backplane (200);
pulling out a cap of the electrical module from an enclosure of the electrical module to drive the fuse out of a clamping portion;
replacing the fuse with a new fuse;
inserting the cap into the enclosure; and
inserting the electrical module into the corresponding slot.

13. The electrical module of claim 2, wherein the circuit board further comprises:
a circuit isolation unit at least arranged between the power input port and the output port to isolate the power input port and the output port,
wherein the fuse detecting circuit is coupled to the output port via the circuit isolation unit.

14. The electrical module of claim 13, wherein the circuit board further comprises:
an indicating circuit coupled to the fuse detecting circuit via the circuit isolation unit and adapted to indicate the status of the fuse by using at least one of a light emitting unit or a sound emitting unit.

15. The electrical module of claim 13, wherein the circuit isolation unit comprises a photoelectric converter, a transformer or a capacitor.

16. The backplane of claim 11, wherein the circuit board further comprises:
at least one signal input/output port adapted to input an external signal of the external device and/or output a controller signal to the extern device,
wherein the output port is further adapted to provide the detecting signals based on the external signal to the controller.

17. The backplane of claim 11, wherein the circuit board further comprises:
a circuit isolation unit at least arranged between the power input port and the output port to isolate the power input port and the output port,
wherein the fuse detecting circuit is coupled to the output port via the circuit isolation unit.

18. The backplane of claim 17, wherein the circuit board further comprises:
an indicating circuit coupled to the fuse detecting circuit via the circuit isolation unit and adapted to indicate the status of the fuse by using at least one of a light emitting unit or a sound emitting unit.

19. The backplane of claim 17, wherein the circuit isolation unit comprises a photoelectric converter, a transformer or a capacitor.

20. The backplane of claim 11, wherein the fuse holder comprises:
a clamping portion adapted to clamp the fuse; and
soldering pins fixedly connected to the clamping portion and arranged on the circuit board so that the fuse is electrically coupled to the power input port,
wherein the soldering pins each comprises a bent portion to allow sections of the soldering pins adjacent to the clamping portion to extend parallel to the circuit board.

* * * * *